(12) United States Patent
Doležal et al.

(10) Patent No.: US 11,802,823 B2
(45) Date of Patent: Oct. 31, 2023

(54) SYSTEM AND METHOD FOR HANDLING CRYO-CHARGED PARTICLE SAMPLES

(71) Applicant: FEI Company, Hillsboro, OR (US)

(72) Inventors: Vojtěch Doležal, Brno (CZ); Hans Persoon, Eindhoven (NL); John Mitchels, Brno (NL)

(73) Assignee: FEI Company, Hillsboro, OR (US)

( * ) Notice: Subject to any disclaimer, the term of this patent is extended or adjusted under 35 U.S.C. 154(b) by 167 days.

(21) Appl. No.: 17/523,246

(22) Filed: Nov. 10, 2021

(65) Prior Publication Data
US 2022/0155193 A1    May 19, 2022

(30) Foreign Application Priority Data

Nov. 18, 2020  (EP) .................................... 20208366

(51) Int. Cl.
*G01N 1/42*  (2006.01)
*H01J 37/20*  (2006.01)
*H01J 37/26*  (2006.01)

(52) U.S. Cl.
CPC ............... *G01N 1/42* (2013.01); *H01J 37/20* (2013.01); *H01J 37/26* (2013.01); *H01J 2237/2007* (2013.01)

(58) Field of Classification Search
CPC .. G01N 1/42; H01J 37/20; H01J 37/26; H01J 2237/2007
See application file for complete search history.

(56) References Cited

FOREIGN PATENT DOCUMENTS

WO     2020119956     6/2020

OTHER PUBLICATIONS

Extended European Search Report dated Apr. 22, 2021 for EP Application No. 20208366.3.
Sebastian Tacke et al: A Versatile High-Vacuum Cryo-transfer System for Cryo-microscopy and Analytics, Biophysical Journal, vol. 110, No. 4, Feb. 1, 2016, pp. 758-765, Amsterdam, NL.

*Primary Examiner* — Nicole M Ippolito
*Assistant Examiner* — Hanway Chang

(57) ABSTRACT

The invention relates to a Cryo-Charged Particle (CCP) sample handling and storage system. The system is used for storing and handling cryo-samples for use in charged particle microscopy, such as cryo-electron microscope samples for use in cryo-transmission electron microscopy. The system comprises a storage apparatus for storing a plurality of CCP samples, and a Charged Particle Apparatus (CPA), such as a cryo-TEM, at a location remote from said storage apparatus. The system further comprises a transfer device that is releasably connectable to said storage apparatus, and that is releasably connectable to said CPA as well. As defined herein, said transfer device is arranged for acquiring a CCP sample from said plurality of CCP samples when connected to said storage apparatus, and arranged for transferring said CCP sample from said transfer device to said CPA when connected to said CPA.

19 Claims, 8 Drawing Sheets

SYSTEM AND METHOD FOR HANDLING CRYO-CHARGED PARTICLE SAMPLES

FIELD OF THE INVENTION

The invention relates to a system and method for handling Cryo-Charged Particle (CCP) samples, comprising a storage apparatus, a transfer device and a Charged Particle Apparatus (CPA), such as a Charged Particle Microscope (CPM).

BACKGROUND OF THE INVENTION

Biology is the natural science that studies life and living organisms, including their physical structure, chemical processes, molecular interactions, physiological mechanisms, development and evolution.

Cell biology is a branch of biology that studies the structure and function of the cell, the basic unit of life. Cell biology is concerned with the physiological properties, metabolic processes, signalling pathways, life cycle, chemical composition and interactions of the cell with their environment. In cell biology, molecular recognition between macromolecules governs all of the most sophisticated processes in cells. The most common macromolecules comprise biopolymers (nucleic acids, proteins, carbohydrates and lipids) and large non-polymeric molecules (such as lipids and macrocycles).

Many researchers are interested in studying macromolecular complexes in their natural environment at high resolution in order to reveal their structural dynamics and interactions. To this end, charged particle microscopy may be used.

Charged particle microscopy is a well-known and increasingly important technique for imaging microscopic objects, particularly in the form of electron microscopy (EM). Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. The skilled person will be familiar with the different species of charged particle microscopy.

In a SEM, irradiation of a sample by a scanning electron beam precipitates emanation of "auxiliary" radiation from the sample, in the form of secondary electrons, backscattered electrons, X-rays and cathodoluminescence (infrared, visible and/or ultraviolet photons). One or more components of this emanating radiation may be detected and used for sample analysis.

In TEM, a beam of electrons is transmitted through a specimen to form an image from the interaction of the electrons with the sample as the beam is transmitted through the specimen. The image is then magnified and focused onto an imaging device, such as a fluorescent screen, a layer of photographic film, or a sensor such as a scintillator attached to a charge-coupled device (CCD). The scintillator converts primary electrons in the microscope to photons so that the CCD is able to detect it.

EM provides a number of ways to study biological samples: conventional TEM is used to study gross morphology of biological samples; electron crystallography and single-particle analysis are dedicated to study proteins and macromolecular complexes; and (cryo-)electron tomography and Cryo-EM of vitreous sections (CEMOVIS) are aimed at cellular organelles and molecular architectures. In Cryo-EM and CEMOVIS, samples are preserved by rapid freezing using a vitrification technique, and observed by cryo-TEM. CEMOVIS additionally includes the cryo-sectioning of the sample, which may be done using a cryo-FIB technique.

Preparing a biological sample for study in an analysis device often is time consuming and labour intensive. Preparing a Cryo-EM specimen, for example, comprises the steps of taking an aqueous sample of a biological material (usually a purified protein complex), applying it to a support structure (grid), reducing its dimension to a layer that is as thin as possible (~100-800 Å, depending on the size of the biological molecule), and then freezing this layer fast enough to prevent the water from crystallising. Many aspects of this process of preparing a biological sample are problematic.

Once the Cryo-EM sample is prepared it needs to be stored and handled at appropriate conditions for later use in a Charged Particle Microscope. To this end, a plurality of cryo-EM samples may be stored in individual grid boxes. These grid boxes can be placed in conical falcon tubes that are then stored into long-term liquid nitrogen storage dewars.

Once required, the falcon tube is taken out of the dewar, and the correct grid box corresponding to the desired sample is retrieved from the falcon tube.

SUMMARY

A Cryo-Charged Particle (CCP) sample handling and storage system, comprises a storage apparatus for storing a plurality of CCP samples; a Charged Particle Apparatus (CPA) at a location remote from said storage apparatus; and a transfer device that is releasably connectable to said storage apparatus, and wherein said transfer device is furthermore releasably connectable to said CPA, and wherein said transfer device is arranged for acquiring a CCP sample from said plurality of CCP samples when connected to said storage apparatus, and arranged for transferring said CCP sample from said transfer device to said CPA when connected to said CPA.

A method for transferring a sample in a CCP sample handling system comprises the steps of: storing at least one CCP sample in said storage apparatus connecting said transfer device to said storage apparatus; transferring said CCP sample from said storage apparatus to said transfer device; dismounting said transfer device from said storage apparatus; moving said transfer device to said Charged Particle Apparatus (CPA), wherein said CPA is located remotely from said storage apparatus; connecting said transfer device to said CPA; transferring said CCP sample from said transfer device to said CPA.

DETAILED DESCRIPTION

Figure 1:
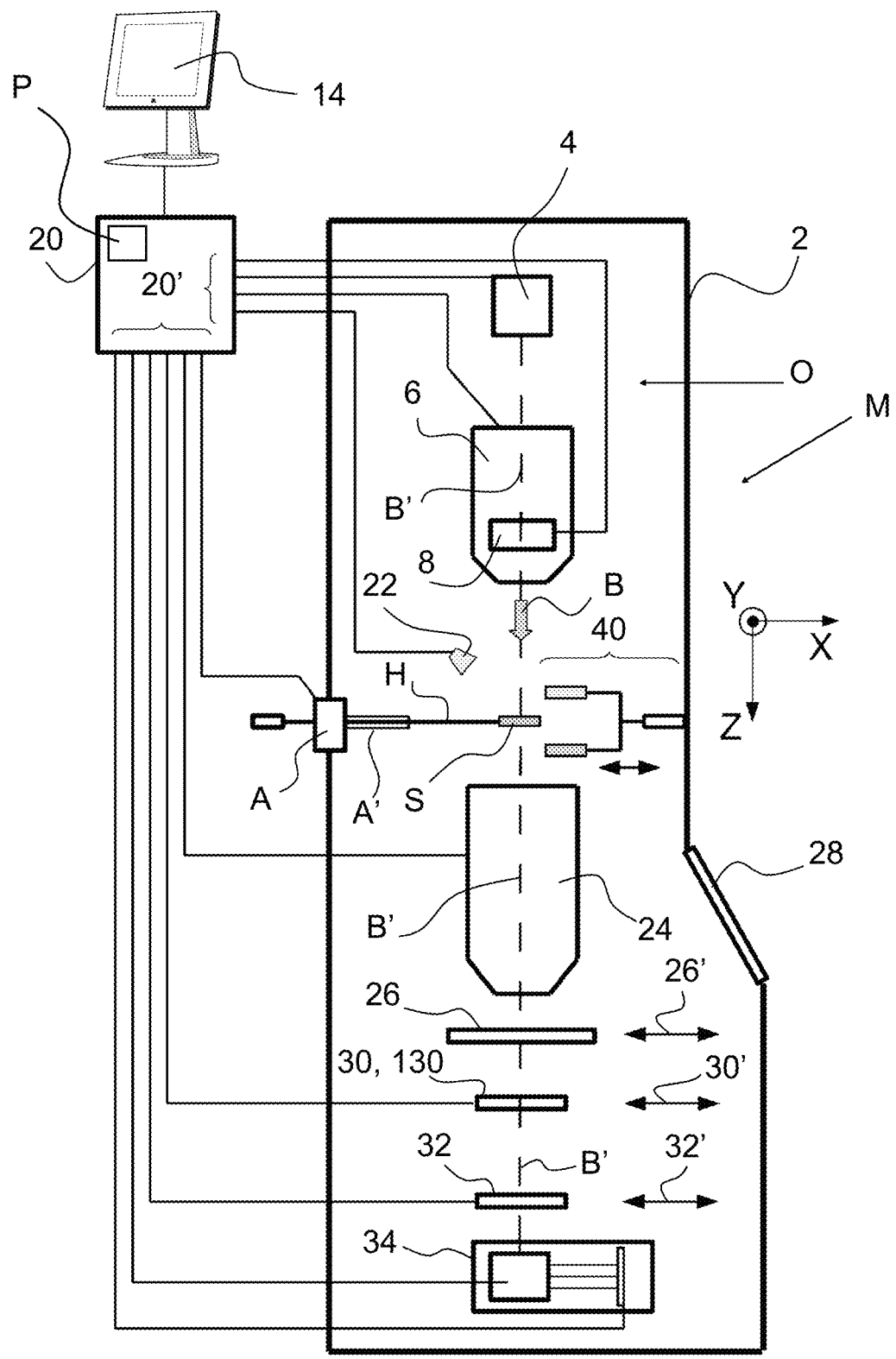
FIG. 1—shows a longitudinal cross-sectional view of a charged particle microscope according to a first embodiment of the invention.

Different methods can be applied for putting the desired sample into the Cryo-Electron Microscope.

In a first embodiment, a cryo-transfer holder may be used. This is a liquid nitrogen holder that is designed for the frost-free transfer of a sample at liquid nitrogen temperature into a transmission electron microscope (TEM). The sample is taken out of the grid box and manually placed inside the cryo-transfer holder. Then the cryo-transfer holder may be connected to the TEM. The cryo-transfer holder holds the sample in place inside the TEM during the acquisition. The placement of the cryo-transfer holder inside the TEM has proven to be troublesome, as the failure rate of cryo-holder insertion into the microscope is relatively high. During a 20-minute period after connecting the cryo-transfer holder, there is a significant amount of sample drift taking place. Furthermore, the cryo-transfer holder limits the throughput of samples in the TEM, as the cryo-transfer holder needs to be manually refilled with liquid nitrogen every 12 hours, and there is a 4-hour long cryo-cycle of the microscope that is required after 4-5 insertions.

In a second embodiment, the sample is loaded into the TEM using a cryogenic sample manipulation robot, such as AutoLoader sold by Thermo Scientific™, The AutoLoader is a module that is installed as part of the TEM. Samples are manually placed inside AutoLoader Cartridges. These AutoLoader Cartridges are then stored in cryogenic storages, such as a dewar. Once required, the Cartridges are retrieved from the dewar and placed inside the AutoLoader Module. The desired sample is then taken out of the cartridge by the manipulation robot, which transfers the sample to the sample holder inside the TEM. Then the sample can be imaged using the TEM. Although this known system provides excellent results, especially in terms of sample transfer quality and screening throughput, there is still room for improvements on other levels, such as, for example, improved sample loading into cartridges, complexity, ease of installation and maintenance, and associated costs.

From the above it thus follows that there is a desire for an improved sample storage and handling system that provides an improved user experience for storing cryogenic samples, transferring cryogenic samples, and studying cryogenic samples in a charged particle microscope or similar apparatus.

To this end, the disclosure provides a Cryo-Charged Particle (CCP) sample handling and storage system. The handling and storage system may be arranged for handling and storing Cryo-EM samples, for example.

The system as defined herein comprises a storage apparatus for storing a plurality of CCP samples. The storage apparatus is arranged for storing the CCP samples, such as Cryo-EM samples that are provided on a grid, under cryogenic conditions.

The system further comprises a charged Particle Apparatus (CPA) at a location remote from said storage apparatus. The distance between the CPA and the storage apparatus is such that a direct transfer of a sample between the storage apparatus and the CPA is impossible. Thus, the system further comprises a transfer device that is arranged to be movable between the storage apparatus and the CPA.

The transfer device is releasably connectable to said storage apparatus. By this it is meant that the transfer device can be connected and disconnected to the storage apparatus. The transfer device is furthermore releasably connectable to said CPA, and thus the transfer device may be connected and disconnected to said CPA. In a disconnected state of the transfer device, the transfer device is movable between the storage apparatus and the CPA. In a connected state of the transfer device, sample transfer between the transfer device and the apparatus it is connected to is possible. The transfer device may thus be arranged for acquiring a CCP sample from said plurality of CCP samples when connected to said storage apparatus. Additionally, the transfer device may be arranged for transferring said CCP sample from said transfer device to said CPA when connected to said CPA.

With this, it becomes possible to connect a single transfer device to a storage apparatus and acquire a sample, and transport the transfer device with the sample to the CPA, such as a TEM, for loading the sample into the CPA. The transfer from said transfer device to said CPA may include a transfer to a sample holder (i.e. sample stage) that is part of the CPA.

Thus, the sample storage and handling system, and in particular the transfer device as defined herein, allows a quick and easy collection of a sample that is stored under cryogenic conditions, to a charged particle apparatus, such as a TEM, for being studied. Sample collection (i.e. acquisition from the storage apparatus), and sample drop-off (i.e. transfer to the CPA) can be done semi-automatically, i.e. without any human operator actually handling the sample. The transport from the storage apparatus to the CPA may be done manually, i.e. by a human operator carrying the transfer device from the storage apparatus to the CPA.

It is noted that the storage and handling system may be arranged for a return transfer as well. In other words, the transfer device is arranged for acquiring a sample at the CPA, and for transferring said sample from said transfer device to said storage apparatus. This increases the versatility of the storage and handling system as defined herein.

From the above it follows that the invention as described herein provides an improved Cryo-Charged Particle storage and handling system, with which cryo-EM samples, or the like, can be easily and safely stored, be transferred to a charged particle apparatus, such as a (Cryo-)TEM, and be returned to the storage apparatus. Thus an improved storage and handling system is obtained, with which the object as defined herein is achieved.

Advantageous embodiments will be discussed below.

In an embodiment, the system comprises at least one further CPA. The transfer device is arranged to be releasably connectable to said further CPA, and thus the transfer device may be connected and disconnected to said further CPA as well. In a disconnected state of the transfer device, the transfer device is movable between the storage apparatus, the CPA and the at least one further CPA. In a connected state of the transfer device, sample transfer between the transfer device and the apparatus it is connected to, such as the further CPA, is possible. The transfer device may thus be arranged for transferring said CCP sample from said transfer device to said further CPA when connected to said further CPA. Thus, a single transfer device can be used in a system where a plurality of CPAs are present. This central approach to the storage and handling system ensures that each of the plurality of CPAs do not require a specific dedicated transfer mechanism, such as would be the case when each of the CPAs were to be equipped with an AutoLoader module, for example. This way, the system may be constructively simple and therefore relatively cheap.

In an embodiment, the transfer device comprises a transfer mechanism that is arranged for acquiring said CCP sample from said storage apparatus when connected to said storage apparatus, and for delivering said CCP sample to said CPA when connected to said CPA. The transfer mechanism ensures a safe and reliable transfer between the apparatuses of the system, and the transfer device. No manual labour or manual sample handling is required for transferring a sample from storage apparatus to the transfer device. Additionally, no manual labour or manual sample handling is required for transferring the sample from the transfer device to the CPA.

The transfer mechanism may comprise a gripper, for example. The gripper may be arranged for gripping a CCP sample, in particular a cryo-EM sample.

The CCP samples used in the system may comprise EM grids. These grids are known per se to those skilled in the art, and may comprise a small (several millimeters) copper disc that comprises a fine mesh with a carbon foil on top. The grid may be composed of other materials as well. A liquid matrix layer comprising a biological specimen to be studied and is applied to one side of the sample grid, and is then vitrified using a cryogenic cooling process that is known per se to those skilled in the art. The vitrified samples may then be stored in the storage apparatus. A human operator may manually load the samples into the storage apparatus. In an embodiment, that is the only direct human sample manipulation that is required to be used in the system.

Manually loading the samples into the storage apparatus may comprise the step of manually loading individual samples into a sample cassette. The storage apparatus may comprise at least one cassette for storing at least a part of said plurality of CCP samples. The human operator places the desired samples into such a cassette, and then the cassette can be placed inside the storage apparatus. Naturally, the transfer device is arranged for acquiring a sample out of said cassette, in that case.

In an embodiment, said transfer device is arranged to be transferred from said storage device to said CPA by a human operator. This way, the system is relatively flexible, as it allows the storage apparatus and the (at least one) CPA to be positioned at a suitable location, without the need to really position the apparatuses very close to each other.

The storage apparatus may be part of a first working station. The first working station comprises a human operator desk, where the human operator is able to sit or stand. The human operator may manually store or remove a plurality of samples in the storage apparatus. The human operator may additionally, or alternatively, connect the transfer device to the storage apparatus. The transfer device may be docked to a part of the first working station, to that end.

In an embodiment, said storage device and said CPA each comprise a first docking member, and said transfer device comprises a further (second) docking member that is arranged to mate with said first docking member. This way it is relatively easy to establish a connection between the transfer device and the storage device, disconnect the transfer device from the storage device, and move the transfer device to the CPA where the transfer device is subsequently connected to the CPA for transferring the sample from the transferring device to the CPA.

In an embodiment, each of said first docking members comprises a first valve, and said further docking member comprises a further valve, wherein said valves are arranged to be closed in a dismounted condition, and wherein said valves are arranged to be openable in a docked state. This way, the cryogenic conditions and/or other conditions (such as pressure, for example) can be maintained inside the storage apparatus, the transfer device, and the CPA. The transfer device can be connected to the storage apparatus by means of the docking members, and the valves may be opened such that a transfer space of said transfer device is fluidly connected to a storage space of said storage apparatus. The fluid connection between the storage apparatus and the transfer device then allows sample transfer to take place.

In an embodiment, said storage apparatus comprises a cryogenic storage room. The storage room may be fluidly connected to said transfer device, in particular a transfer space thereof. The storage room may be directly connected to said transfer space, in a connected state of the transfer device. An intermediate room may be provided as well. In that case, sample transfer may be done from the storage room to the intermediate room, and then transfer may be done from the intermediate room to the transfer device. The storage apparatus may comprise a transfer mechanism too. The storage apparatus transfer mechanism may be arranged for cooperating with said transfer mechanism of said transfer device, so that effective sample transfer between the storage apparatus and the transfer device may take place.

Said storage apparatus may comprise an operator input device and a control unit. The input device may be part of the first working station, in said embodiment. The operator input device may be arranged for selecting, by a human operator, a CCP sample to be transferred. Said control unit is arranged for controlling said storage apparatus and said transfer device for transferring said selected CCP sample from said storage apparatus to said transfer device, in particular in an automated way. This improves the reliability of the system, as it allows correct labelling of samples and subsequent handling thereof.

According to an aspect, a storage apparatus for storing a plurality of Cryo-Charged Particle (CCP) samples for use in a CCP sample handling system as defined herein is provided. Said storage apparatus is arranged to be releasably connectable to a transfer device, as well as for allowing transfer of a sample of said plurality of CCP samples from said storage apparatus to said transfer device in a connected state thereof.

According to an aspect, a transfer device for transferring a Cryo-Charged Particle (CCP) sample for use in a CCP sample handling system as defined herein is provided. Said transfer device is releasably connectable to a storage apparatus for storing a plurality of CCP samples, as well as releasably connectable to a Charged Particle apparatus, wherein said transfer device is arranged for acquiring a CCP sample from said plurality of CCP samples when connected to said storage apparatus, and arranged for transferring said CCP sample from said transfer device to said CPA when connected to said CPA.

According to an aspect, a Charged Particle Apparatus (CPA), such as a Charged Particle Microscope (CPM), e.g. a (Cryo-)TEM, for use in a Cryo-Charged Particle (CCP) sample handling system as defined herein is provided. The CPA is arranged to be releasably connectable to a transfer device of the system, as well as for allowing transfer of a sample from said transfer device to said CPA in a connected state thereof.

According to an aspect, a method for transferring a sample is provided. The method comprises the steps of providing a CCP sample handling system as defined herein. The method further comprises the steps of:

Storing at least one CCP sample in said storage apparatus;
Connecting said transfer device to said storage apparatus;
Transferring said CCP sample from said storage apparatus to said transfer device;
Dismounting said transfer device from said storage apparatus;
Moving said transfer device to said Charged Particle Apparatus (CPA), wherein said CPA is located remotely from said storage apparatus;
Connecting said transfer device to said CPA; and
Transferring said CCP sample from said transfer device to said CPA.

Advantages of the method as defined herein have been elucidated above. Advantageous embodiments will be described below.

The steps of transferring the sample may be done mechanically. A mechanical transfer mechanism may be used for establishing the transfer.

The steps of transferring the sample may be done automatically. By automatically, it is implied that no sample handling and/or manipulation is required from a human operator. It is conceivable, however, that the human operator initiates the sample transfer, for example by using a button, dial, knob, or the like, or by inputting a corresponding command into a User Interface, such as a Graphical User Interface (GUI).

The steps of connecting and/or dismounting may be done by means of a human operator that physically connects the transfer device to the storage apparatus, or the CPA. Some parts of the connecting and/or dismounting may require the use of docking mechanisms, such as, in an embodiment, opening and closing of valves.

The steps of moving the transfer device may be done by means of a human operator that physically moves the transfer device from and to the storage apparatus and/or the CPA.

The method and system as defined herein allow safe and effective sample transfer, wherein a human operator is used for transferring the sample between relevant apparatuses, and a more dedicated transfer mechanism allows safe and reliable transfer from the transfer device to the apparatuses. With this, the object as defined herein is achieved.

FIG. 1 (not to scale) is a highly schematic depiction of an embodiment of a charged-particle microscope M. More specifically, it shows an embodiment of a transmission-type microscope M, which, in this case, is a TEM/STEM (though, in the context of the current invention, it could just as validly be a SEM (see FIG. 2), or an ion-based microscope, for example). In FIG. 1, within a vacuum enclosure 2, an electron source 4 produces a beam B of electrons that propagates along an electron-optical axis B' and traverses an electron-optical illuminator 6, serving to direct/focus the electrons onto a chosen part of a specimen S (which may, for example, be (locally) thinned/planarized). Also depicted is a deflector 8, which (inter alia) can be used to effect scanning motion of the beam B.

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be illuminated/imaged/inspected by the electron beam B traveling along axis B' (in the Z direction) (and/or allows scanning motion to be performed, as an alternative to beam scanning). If desired, an optional cooling device (not depicted) can be brought into intimate thermal contact with the specimen holder H, so as to maintain it (and the specimen S thereupon) at cryogenic temperatures, for example.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX or EDS (Energy-Dispersive X-Ray Spectroscopy) module, for instance; in such a case, an image could be constructed using basically the same principle as in a SEM. However, alternatively or supplementally, one can study electrons that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux leaving imaging system 24 is generally quite large (e.g. of the order of 1 meter). Consequently, various other types of analysis apparatus can be used downstream of screen 26, such as:

TEM camera 30. At camera 30, the electron flux can form a static image (or diffractogram) that can be processed by controller/processor 20 and displayed on a display device 14, such as a flat panel display, for example. When not required, camera 30 can be retracted/withdrawn (as schematically indicated by arrows 30') so as to get it out of the way of axis B'.

STEM camera 32. An output from camera 32 can be recorded as a function of (X,Y) scanning position of the beam B on the specimen S, and an image can be constructed that is a "map" of output from camera 32 as a function of X,Y. Camera 32 can comprise a single pixel with a diameter of e.g. 20 mm, as opposed to the matrix of pixels characteristically present in camera 30, although camera 32 can be an Electron Microscope Pixel Array Detector (EMPAD) as well. Moreover, camera 32 will generally have a much higher acquisition rate (e.g. $10^8$ points per second) than camera 30 (e.g. $10^2$ images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use).

As an alternative to imaging using cameras 30 or 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

In the embodiment shown, the microscope M further comprises a retractable X-ray Computed Tomography (CT) module, generally indicated by reference 40. In Computed Tomography (also referred to as tomographic imaging) the source and (diametrically opposed) detector are used to look through the specimen along different lines of sight, so as to acquire penetrative observations of the specimen from a variety of perspectives.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired. The controller comprises, as shown in this embodiment, a data processing apparatus P that is arranged for carrying out the method as defined herein.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, camera 32, spectroscopic apparatus 34, etc.

Figure 2:
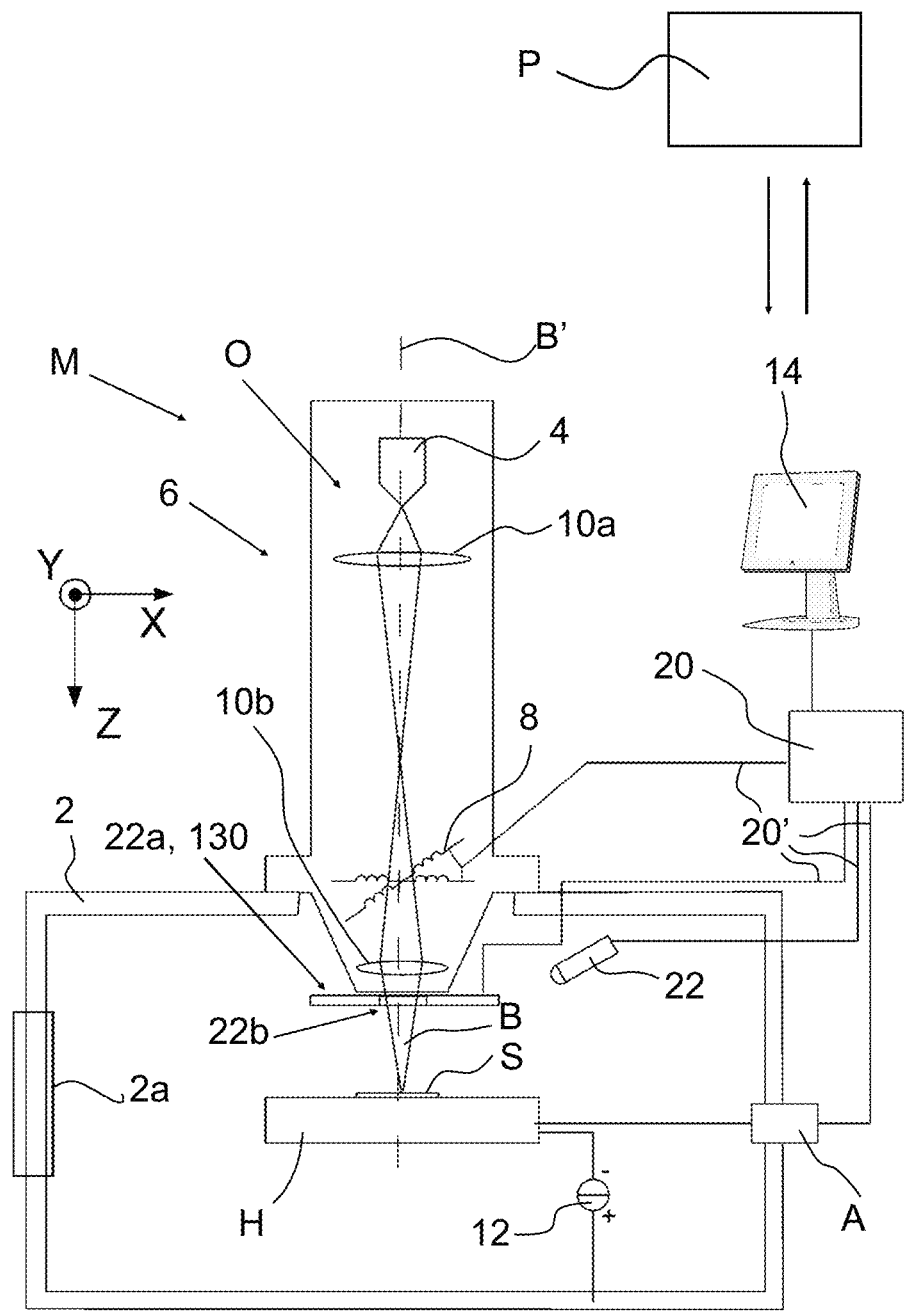
FIG. 2—shows a longitudinal cross-sectional view of a charged particle microscope according to a second embodiment of the invention.

Now referring to FIG. 2, another embodiment of a charged particle apparatus is shown. FIG. 2 (not to scale) is a highly schematic depiction of a charged-particle microscope M; more specifically, it shows an embodiment of a non-transmission-type microscope M, which, in this case, is a SEM (though, in the context of the current invention, it could just as validly be an ion-based microscope, for example). In the Figure, parts which correspond to items in FIG. 1 are indicated using identical reference symbols, and will not be separately discussed here. Additional to FIG. 1 are (inter alia) the following parts:

2a: A vacuum port, which may be opened so as to introduce/remove items (components, specimens) to/from the interior of vacuum chamber 2, or onto which, for example, an ancillary device/module may be mounted. The microscope M may comprise a plurality of such ports 2a, if desired;

10a, 10b: Schematically depicted lenses/optical elements in illuminator 6;

12: A voltage source, allowing the specimen holder H, or at least the specimen S, to be biased (floated) to an electrical potential with respect to ground, if desired;

14: A display, such as a FPD or CRT;

22a, 22b: A segmented electron detector 22a, comprising a plurality of independent detection segments (e.g. quadrants) disposed about a central aperture 22b (allowing passage of the beam B). Such a detector can, for example, be used to investigate (the angular dependence of) a flux of output (secondary or backscattered) electrons emerging from the specimen S.

Here also, a controller 20 is present. The controller is connected to the display 14, and the display 14 may be connectable to a data processing apparatus P that is arranged for carrying out the method as defined herein. In the embodiment shown, the data processing apparatus P is a separate structure that does not form part of the controller, and does not even form part of the microscope P. The data processing apparatus P may be local or cloud based, and is in principle not limited to any location.

The charged particle apparatuses shown in FIGS. 1 and 2, and Electron Microscope (EM) in particular, offer a number of ways to study biological samples: conventional TEM is used to study gross morphology of biological samples; electron crystallography and single-particle analysis are dedicated to study proteins and macromolecular complexes; and (cryo-)electron tomography and Cryo-EM of vitreous sections (CEMOVIS) are aimed at cellular organelles and molecular architectures.

As indicated in the introduction, these biological samples can be preserved by rapid freezing using a vitrification technique, to be subsequently studied using a cryo-EM technique, such as cryo-TEM. Cryo-sectioning of the sample, using a cryo-FIB technique, may be part of sample study.

Samples used in these studies, must first be prepared, and are then stored. To this end, an aqueous sample of a biological material (usually a purified protein complex) is taken and applied to a support structure (grid), the dimension is reduced to a very thin layer, and then this layer is frozen fast enough to prevent the water from crystallising. Samples are then prepared and stored for further handling.

Figure 3:
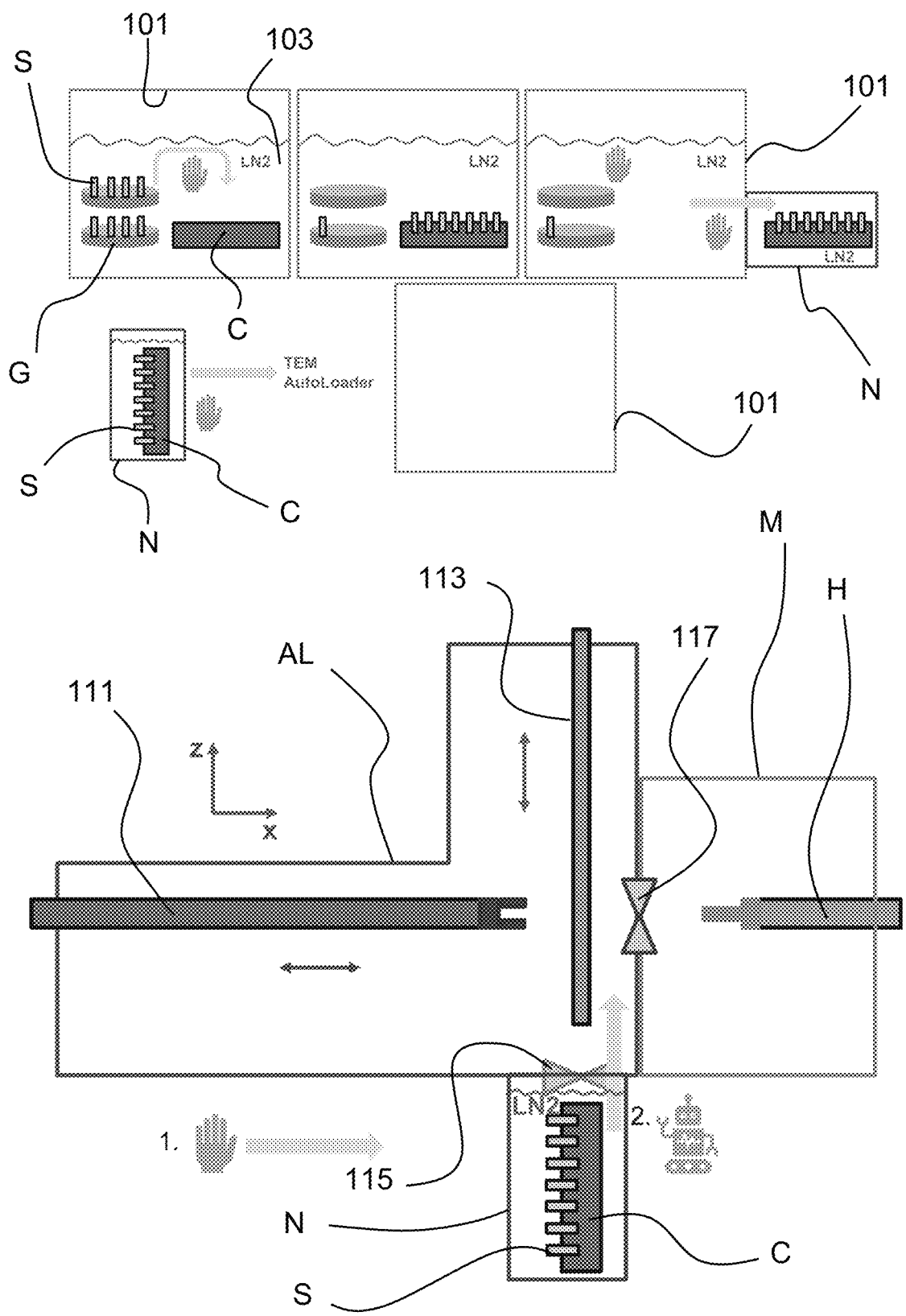
FIG. 3—shows a prior art sample handling and storage method.

As indicated in the introduction, one of the methods for storing and handling samples relates to a so-called AutoLoader. Now referring to FIG. 3, an embodiment of this prior art technique is discussed. FIG. 3 shows a workflow of collecting samples S for transport to a charged particle microscope M, such as a cryo-TEM, using an AutoLoader AL and associated NanoCab N cartridge. The AutoLoader AL is part of the microscope M. The NanoCab is loaded with a plurality of samples S, and then transported to the AutoLoader AL for loading a sample into the TEM.

Shown in FIG. 3, top row, from left-to-right, is the preparation of the NanoCab N. A plurality of samples S (i.e. a biological specimen that is provided on a grid) are provided in gridboxes G. The gridboxes G with the samples S are put into a loading station 101. The loading station 101 is filled with liquid nitrogen 103, keeping the samples S and the gridboxes G at a desired, low, temperature. A cassette C is also provided in the liquid nitrogen 103. The samples S are manually transferred from the gridboxes G to the cassette C. Once the cassette is full, the Nanocab device N is connected to the loading station 101, and the cassette is provided inside the Nanocab N. The Nanocab device N now contains the cassette C with desired samples S, wherein the Nanocab N device is filled with liquid nitrogen for keeping the samples S at the desired, low, temperature. The loading station 101 can then go back to room temperature, as the liquid nitrogen is removed from the loading station when, or after, the cassette C is introduced into the Nanocab device N.

FIG. 3, bottom part, shows that the Nanocab N, comprising the cassette C with a plurality of samples S, is connected to an Autoloader AL module. The Autoloader AL module is connected to a microscope, or is part thereof.

The Autoloader AL module comprises a cassette arm 113, and a sample arm 111. The inside of the Autoloader AL housing is kept at a desired, low, temperature that is arranged for preserving cryo-Samples. The Autoloader AL module comprises two valve elements 115, 117. The first one 115 is able to provide a connection to a connected Nanocab N. The second one 117 is able to provide a connection to the microscope M.

The procedure for loading the samples from the Nanocab N to the microscope M is as follows. The Nanocab N is connected to the Autoloader AL, as shown in FIG. 3, lower part. The valve 115 is opened, and the cassette arm 113 reaches downwards to grab the cassette C with samples S, after which upwards movement is initiated for moving a desired sample S in front of the sample arm 111. The valve 115 can be closes again.

The sample arm 111 can then collect a sample S, after which the cassette arm 113 moves the cassette C with the remaining samples further upwards, and out of the way of the sample arm 111.

Then, the valve 117 can be opened, and the sample arm 111 moves the sample towards the sample holder H of the microscope M. Once the sample S is transferred to the microscope M, the sample arm 111 can return, and the valve 117 can be closed again. Then, observation or manipulation of the sample can take place.

As indicated, this known Autoloader AL system provides excellent results, especially in terms of sample transfer quality and screening throughput. There exists, however, a desire for improving this system, in particular with respect to sample loading, complexity, ease of installation and maintenance, and associated costs.

To this end, the invention provides a system for handling and storing cryo-charged-particle samples, such as cryo-EM samples. In general, this system comprises a storage apparatus, a charged particle apparatus, and a transfer device that is arranged for transferring cryo-Samples from the storage apparatus to the charged particle apparatus.

Figure 4:
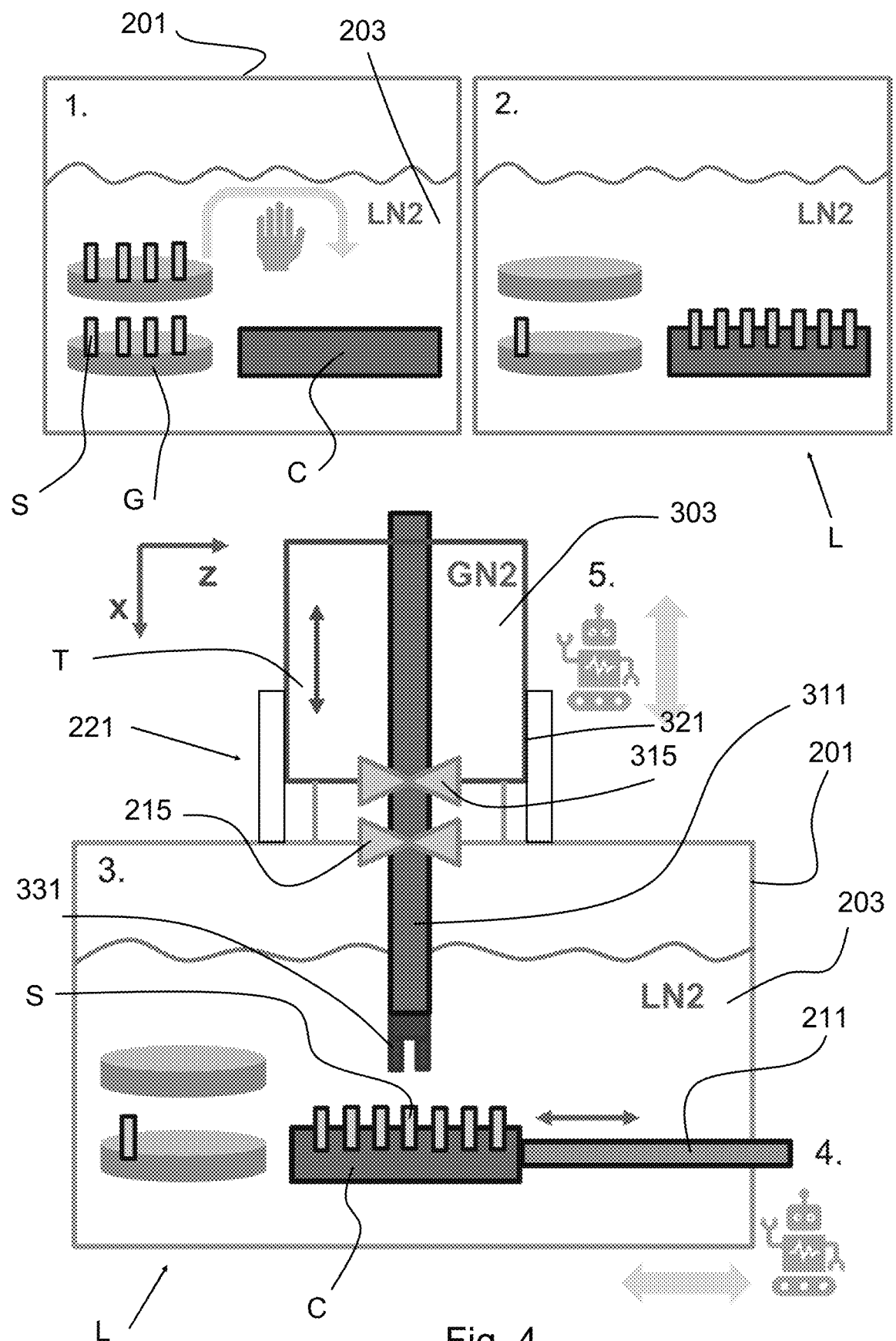
FIG. 4—shows an embodiment of a sample handling and storage method and apparatus as defined herein.

FIG. 4 shows an embodiment of the storage apparatus L. The top row of FIG. 4 shows how samples S are loaded into the storage apparatus L. To this end, samples are provided in gridboxes G. The gridboxes are placed inside a housing 201 of the storage apparatus L, wherein said housing 201 is partly filled with liquid nitrogen 203. A cassette C is provided in the liquid nitrogen 203 as well. The samples are then manually transferred (step 1.) from the gridbox G to the cassette C. Once the samples S are transferred, the cassette C remains (step 2.) inside the housing of the storage apparatus L. The cassette C may be moved, such as for example using cassette arm 211 (see bottom part of FIG. 4), to a separate storage location of the storage apparatus (not shown).

As shown in FIG. 4, the cassette C with samples S is stored inside the housing 201 of the storage apparatus L. In this sense, the housing 201 with liquid nitrogen 203 provides a cryogenic storage room for safely storing the samples inside the storage apparatus.

Once a desired sample is required, the following procedure may be followed. First, a transfer device T as defined herein is provided, and said transfer device T is connected to the storage apparatus S.

The transfer device T comprises a housing 303 that is filled with gaseous nitrogen 303, in which a sample S to be transferred can be temporarily stored at the right temperature. The transfer device T comprises a transfer arm 311 with a gripper 331. The gripper 331 may be used for collecting a sample S. The gripper with the sample S may then be moved inside the housing 303 of the transfer device T.

In the embodiment shown in FIG. 4, the storage apparatus L comprises a valve member 215. The transfer device T also comprises a valve member 315. The storage apparatus comprises a first docking member 221 that is arranged to mate with a second docking member 321 of the transfer device T (shown schematically). The storage apparatus may comprise a slot 221, and a housing part 321 of the transfer device may slide into said slot 221 for providing a connected state of the transfer device T and the storage apparatus. This way, a translational docking is provided. Other docking mechanisms or ways of connecting the transfer device T to the storage apparatus L are conceivable as well. It is advantageous in case the docking member 321 of the transfer device T acts as a male connector 321, and the docking member 221 of the storage apparatus L acts as a female connector 221.

Once the transfer device T is connected (or docked) to the storage apparatus L, transfer of the sample S can take place. The valve 315 of the transfer device T is opened, and the valve of the storage apparatus 215 is opened as well. The cassette arm 211 positions the desired sample S in line with the transfer arm 311 of the transfer device T. The transfer arm 311 moves inside the housing 201 of the storage apparatus L, and picks the sample S out of the cassette C, using the gripper 331. The transfer device T is thus arranged for acquiring a sample S out of said cassette C. The gripper 331 with the sample S is then moved to the inside of the housing 303 of the transfer device T. All valves 215, 315 are then closed. The transfer device T can then be disconnected from the storage apparatus L, for movement to the Charged Particle apparatus.

Indicated in FIG. 4, is that the step of positioning the desired sample S, using cassette arm 211, is done mechanically, and in particular automatically, without handling being required by a human operator. The human operator may, through a user interface, select the desired sample, but movement, positioning, collection and transfer are done automatically. This limits the possibility of errors that can occur.

Figure 5:
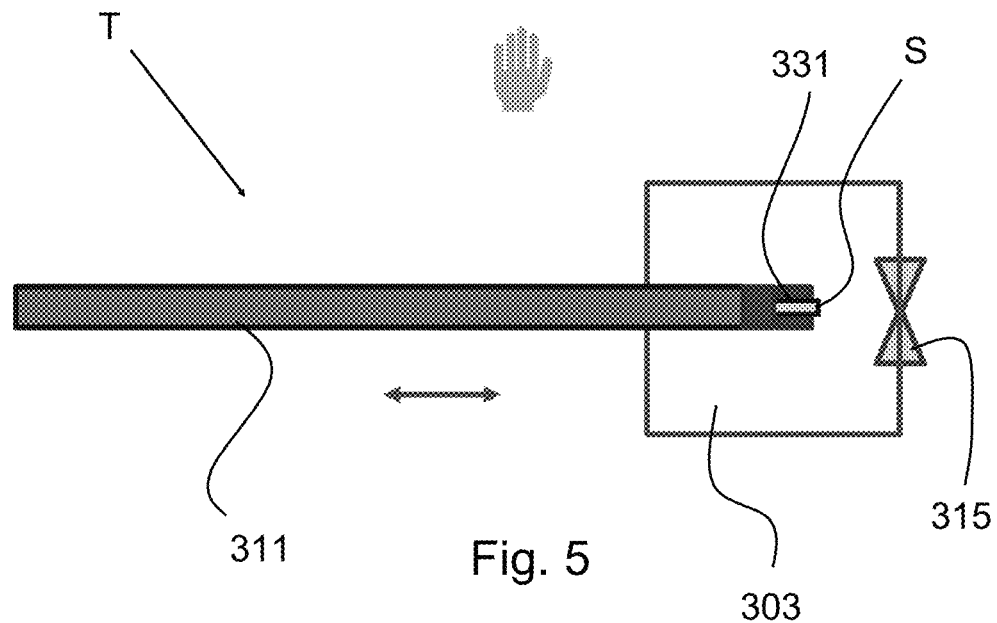
FIG. 5—shows an embodiment of a transfer device for use in a sample handling and storage method and apparatus as defined herein.

FIG. 5 shows the transfer device T in a disconnected state, wherein the sample S is safely seated in gripper 331 of the transfer arm 311. The sample is housed inside housing 303, wherein the housing is filled with gaseous nitrogen to keep the sample at a desired, low, temperature. The heat capacity of the gaseous cold nitrogen inside the housing 303 is such that the transfer device keeps the sample at a desired temperature range for several minutes, such as, for example 15 minutes. Additional cooling means may be provided on, or inside of, the transfer device T to provide active cooling of the sample S inside the housing 331. The transfer device T is transportable by a human operator. The dimensions of the transport device T are chosen such that the average human operator is able to carry the transport device from a first location to a second location, such as for example from the storage apparatus L to the charged particle microscope M. The device may have a length in the order of centimetres, decimetres, or even metres. In a practical embodiment, the device T has a length in between 40 cm to 80 cm, although other dimensions are conceivable as well. The weight of the device T may be in the order of 1 to several kilograms.

Figure 6:
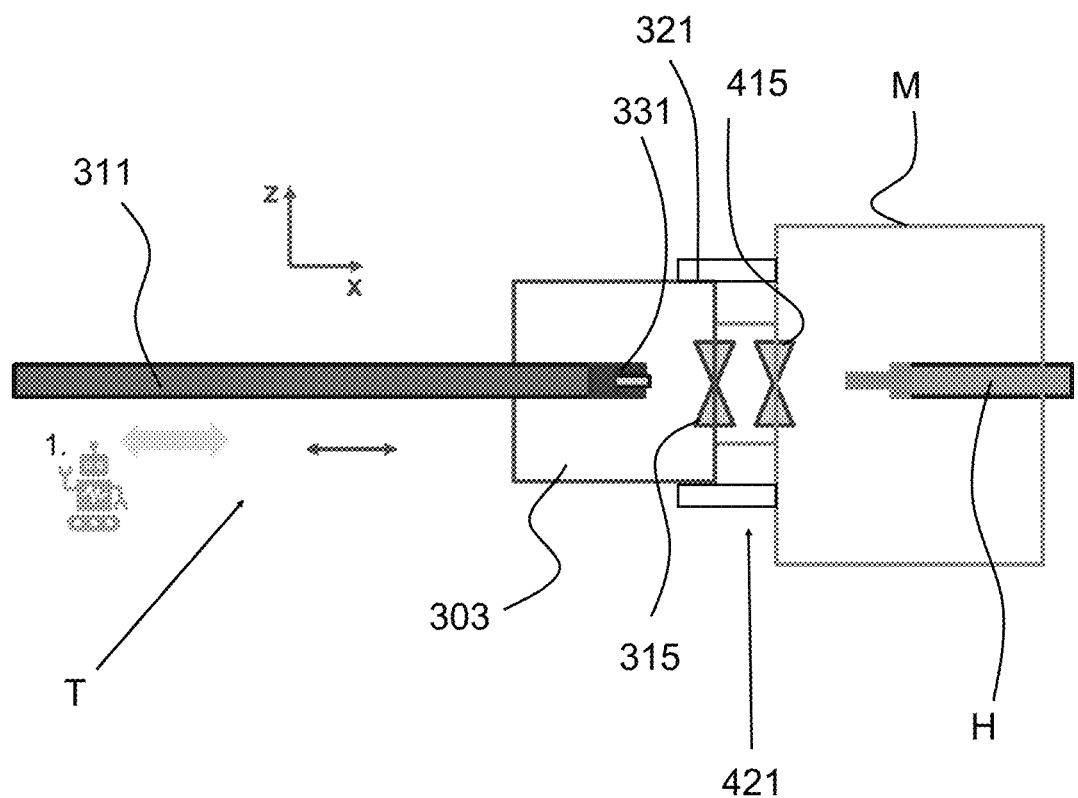
FIG. 6—shows an embodiment of a transfer device and charged particle apparatus for use in a sample handling and storage method and apparatus as defined herein.

FIG. 6 shows the transfer device T being connected to a microscope M. The microscope M is provided with a first docking member 421 that is able to mate with the second docking member 321 of the transport device T. As indicated previously, the docking member 321 of the transport device T may be formed by an external housing part of the transport device T. The microscope M may be provided with a slot 421 that is able to receive the transport device T, or at least the second docking member thereof 321.

The microscope M has a valve member 415. Once the transport device T is connected to the microscope M, or charged particle apparatus CPA in general, the valves 315, 415 can be opened, and the transfer arm 311 can move inside the microscope for transferring the sample S to the holder H of the microscope M. With this, the transfer of the sample from a storage location to the charged particle apparatus, such as an electron microscope M, is complete.

The transfer device T can be removed from the microscope M, and transfer of a second sample S2 may occur, whilst the microscope is examining the first sample S.

FIG. 7a-7f schematically show the sample handling and storage system 500 as defined herein.

Figure 7A:
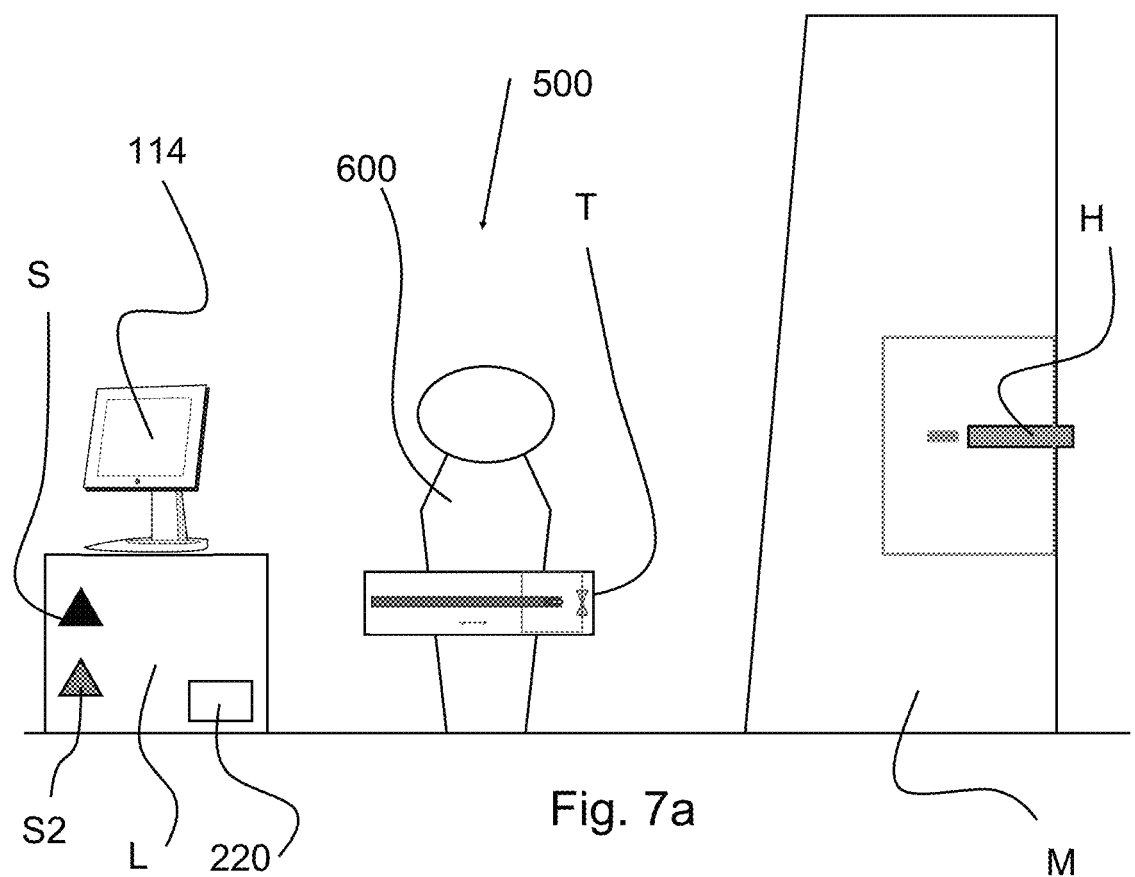
FIGS. 7a, 7b, 7c, 7d, 7e and 7f-show various stages of a method for transferring a sample in a Cryo-Charged Particle (CCP) sample handling system as defined herein.

FIG. 7a shows that the system 500 comprises a storage apparatus L for storing a plurality of samples S, S2. The storage apparatus L may comprise a user input device 114, in the form of a conventional personal computer having a screen, for example.

The system further comprises a Charged Particle Apparatus (CPA) M, such as a SEM, TEM, STEM and/or FIB. The CPA M is positioned at a location remote from said storage apparatus L. This means, in an embodiment that the CPA M is positioned at a distance of at least 50 cm from the storage apparatus L. For example, the CPA may be positioned at a distance of one to several metres from the storage apparatus. In effect, the distance between the storage apparatus L and the Charged Particle Apparatus M is so large, that a direct transfer from the storage apparatus L to the Apparatus M is not possible, and that an intermediate transfer step is necessary. The advantage of such a system is that it is relatively flexible, as the storage apparatus L and the charged particle apparatus can be positioned at any desirable location, even in different rooms with different environmental conditions.

To ensure safe and reliable sample transfer between the charged particle apparatus CPA and the storage apparatus L is possible, the system 500 comprises a transfer device T. The transfer device T can be handled by a human operator 600. The human operator 600 may carry the transfer device T to and from the storage device, and to and from the charged particle apparatus CPA M.

Figure 7B:
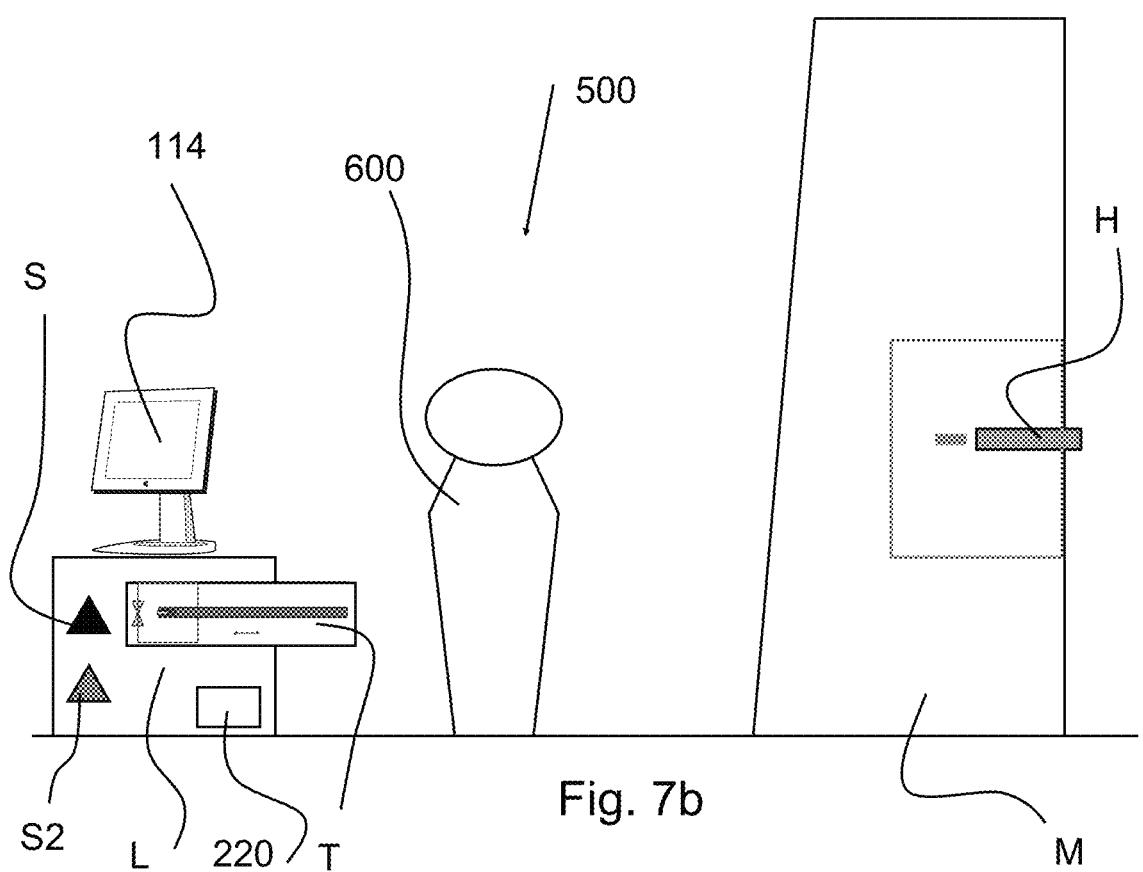
Figure 7C:
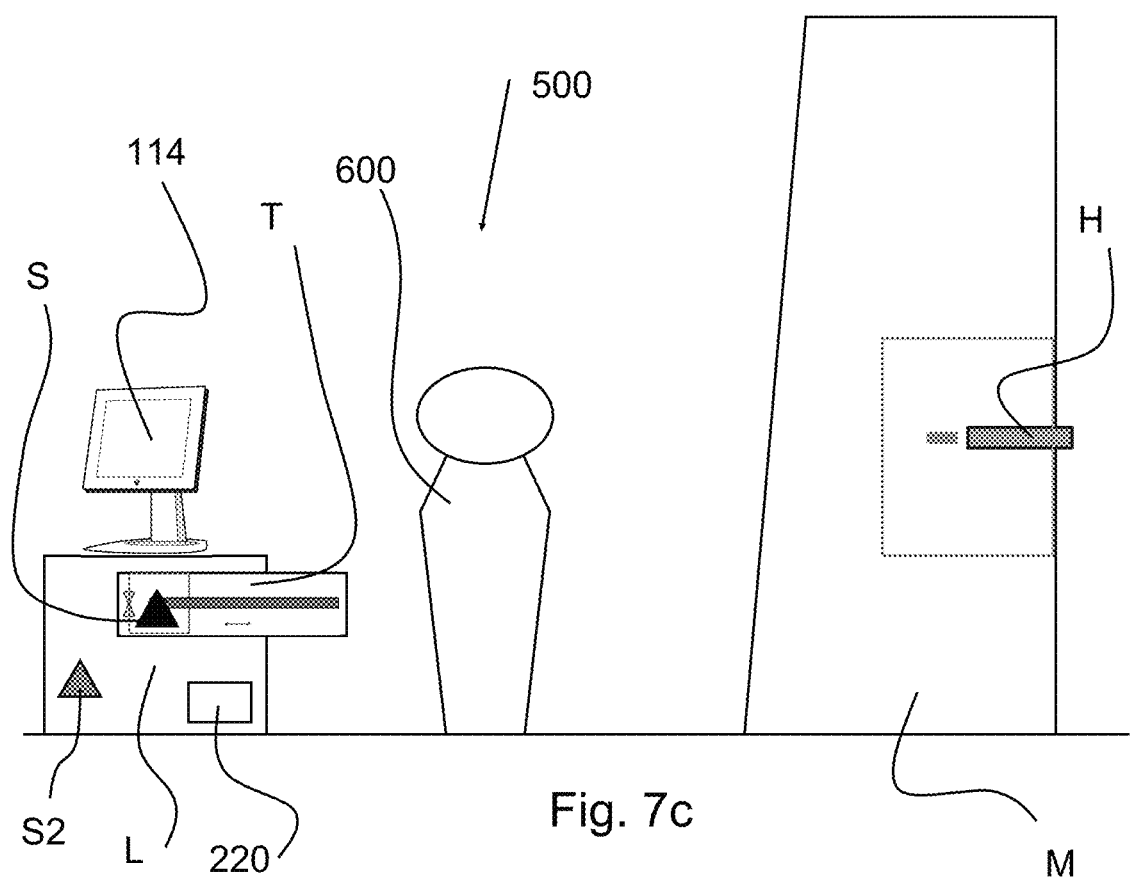
Figure 7D:
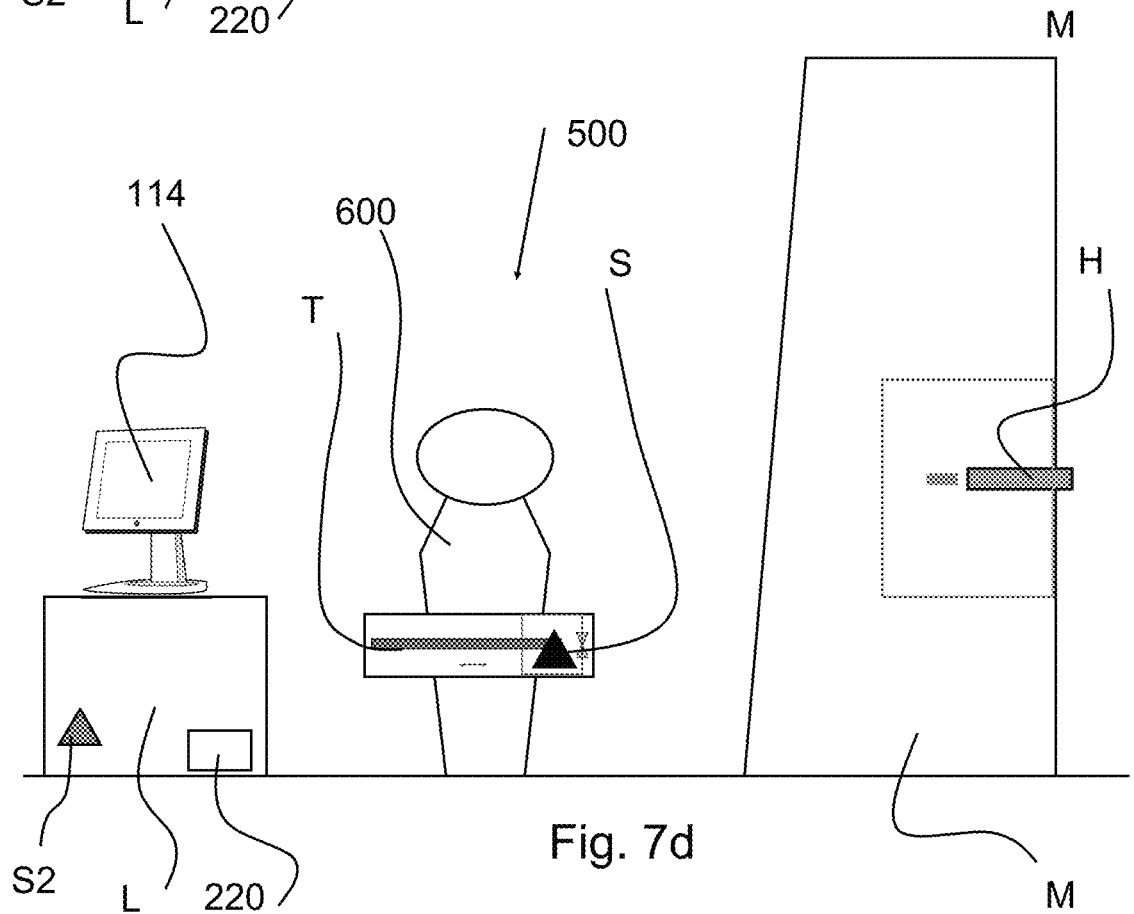

Now turning to FIG. 7b, it is shown that the transfer device T is releasably connectable to said storage apparatus L. As indicated before with respect to FIG. 4, the transfer device is arranged for acquiring a CCP sample S from said plurality of CCP samples S, S2 when connected to said storage apparatus L. To this end, the transfer device T is connected to the storage apparatus L, for example by inserting the transfer device T in a slot that is present in the storage apparatus. Then, the sample transfer as described in FIG. 4 can take place. As shown in FIGS. 7b and 7c, the sample is moved from the storage apparatus L to the transfer device T, in a docked position of the transfer device T with respect to said storage apparatus L. Sample transfer from the storage apparatus L to the transfer device T takes place automatically, in an embodiment, without the need of human operator sample handling.

Once the sample is inside the transfer device T, the human operator may retrieve the transfer device T from the storage apparatus L. The transfer device T with the desired sample S can then be moved to a further location, such as the microscope. The human operator 600 may walk to the further location, wherein the transfer device T is carried by the human operator 600.

Figure 7E:
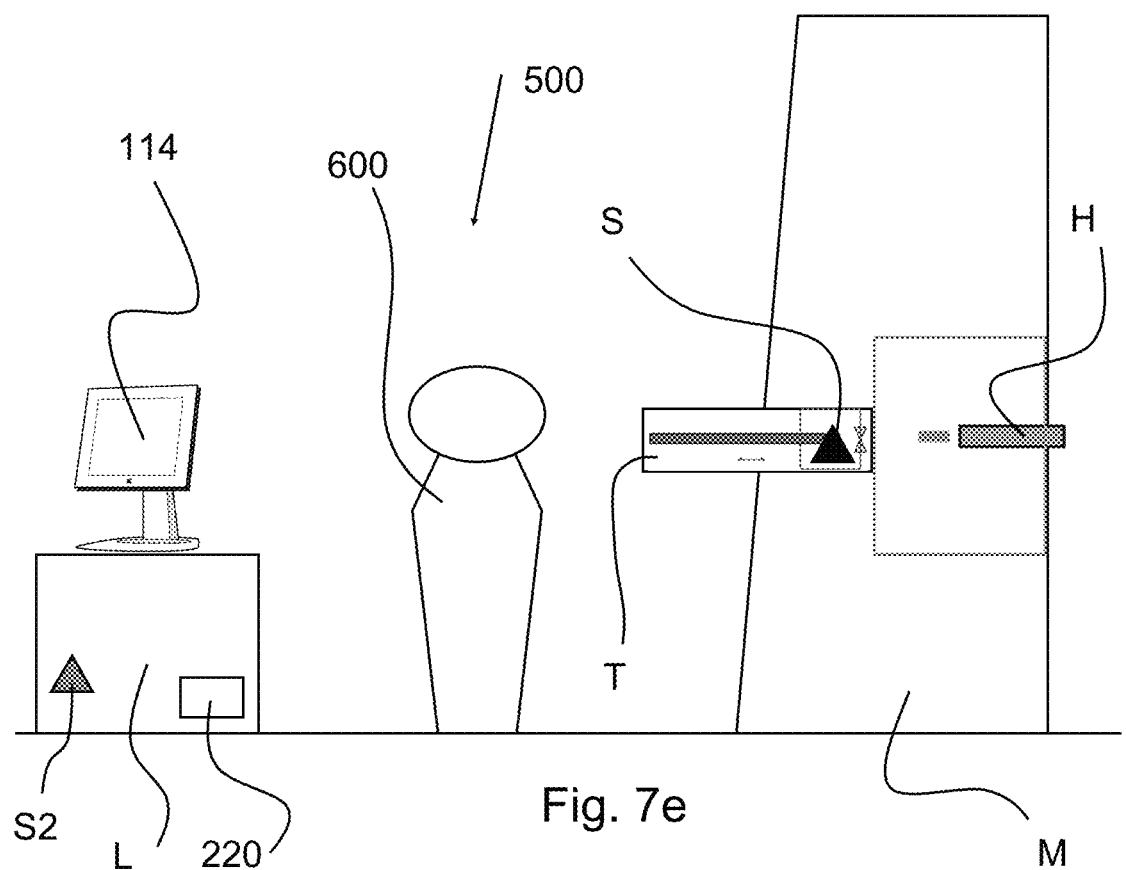
Figure 7F:
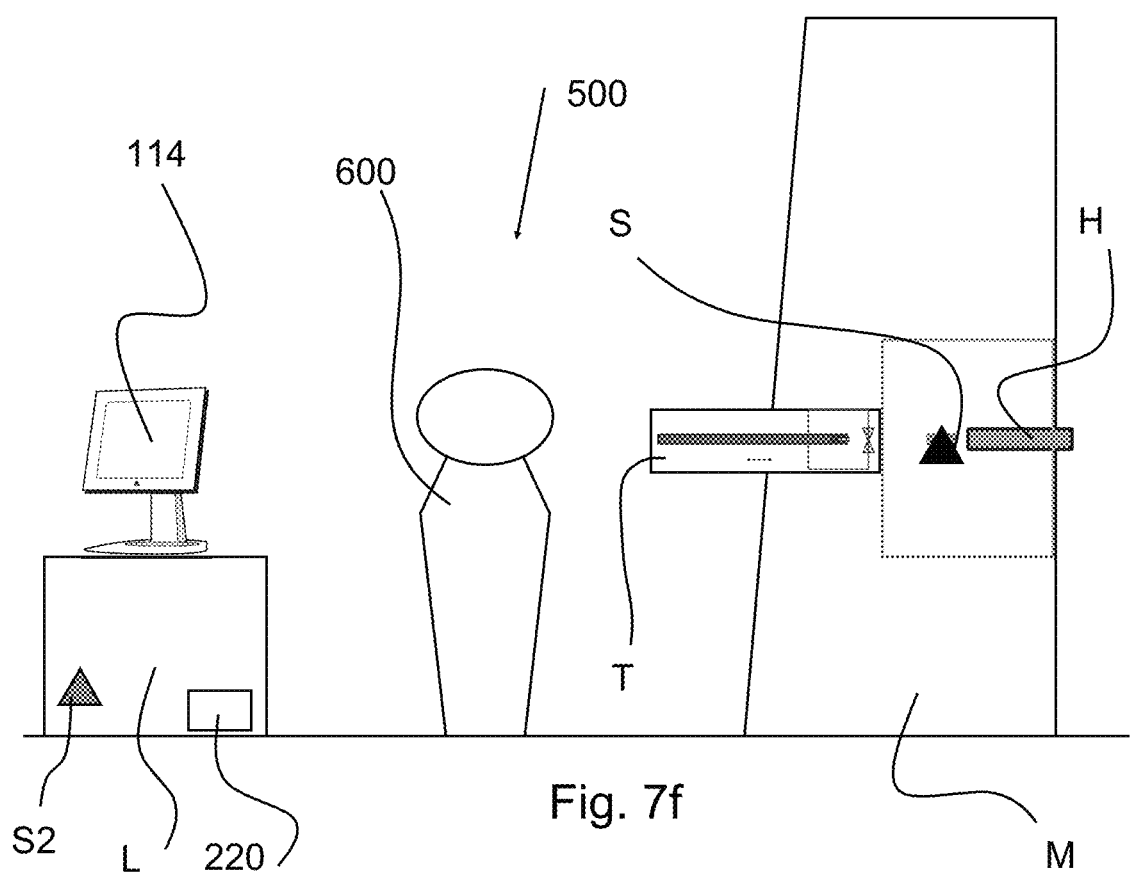

Now turning to FIG. 7e, it is shown that the transfer device T with the sample S is connected to the microscope M (or charged particle apparatus in general). The transfer mechanism of the transfer device T then transfers the sample S from the transfer device T to the sample holder H of the microscope M.

Then, the sample can be observed and/or examined by the microscope M, as described with respect to FIG. 1 and FIG. 2.

As indicated in FIG. 4-7, the transfer device T comprises a transfer mechanism 311, 331 that is arranged for acquiring said CCP sample S from said storage apparatus L when connected to said storage apparatus L, and for delivering said CCP sample to said CPA when connected to said CPA. This way a single mechanism can be used to transfer the sample between two external apparatuses. The apparatuses do not need to have such a mechanism, although they should be arranged to cooperate with the transfer mechanism. Additionally, the apparatuses may comprise additional measures, including mechanical arms 211, valves 215, 415 and the like, for optimizing sample transfer and cooperation with the transfer mechanism 311, 331 of the transfer device.

In an embodiment, the transfer mechanism comprises an movable arm 311. The movable arm may be arranged for translational movement. An outer end of the movable arm 311 may be provided with a gripper 331, wherein said gripper 331 is arranged for gripping and releasing a sample, in particular a sample that comprises a specimen that is provided on a specimen grid. The specimen grid may be connected to other grid elements as well, wherein these grid elements aid in the ease of handling of the sample. The grid elements may comprise, for example, a C-clip ring (i.e. AutoGrid, Thermo Fisher Scientific™) onto which the specimen grid can be mounted, and a C-clip for securing the specimen grid inside the C-clip ring. Other grids are, of course, conceivable as well.

As shown in FIG. 7a-7f, the storage apparatus L comprises an operator input device 114 in the form of a computer, and a control unit 220 that is connected to said operator input device 114 and that is arranged for performing at least some functions of said storage apparatus L, or of said system 500, for example in a connected state of said transfer device T to said storage apparatus L. The operator input device is, in an embodiment, arranged for selecting a CCP sample S, S2 to be transferred, by a human operator 600, from the storage apparatus to the charged particle microscope M. The control unit 220 is arranged for controlling said storage apparatus L and said transfer device T, in a connected state thereof, for transferring said selected CCP sample S from said storage apparatus L to said transfer device T.

The storage apparatus L, including the operator input device 114 may form a first workstation, that enables the human operator to quickly and reliably transfer prepared samples to the storage apparatus L. For example, a top part of the housing 201 of the storage apparatus L may coincide with a desk feature of the workstation. The top part of the housing 201, and/or a desk feature of the workstation, may comprise a lid that is openable and closable by a human operator, such that a gridbox G containing samples S (see FIG. 4, step 1.) can be inserted into the storage apparatus L, and the sample grids S can be transferred to the container C. The lid may also be used for refilling the liquid nitrogen level 203 inside the housing 201. The operator input device and/or the controller may be connected to the housing 201, so that information relating to the housing 201 may be provided to the human operator. For example, the storage apparatus may comprise a number of sensor elements, such as a temperature sensor, a liquid level sensor, or the like, for monitoring a condition of the storage apparatus. The operator input device 114 may provide feedback to the user with respect to one or more of these conditions.

Furthermore, it is conceivable that the operator input device 114 is used for labelling and tracking features. In an embodiment, the operator input device 114 may be wirelessly connected to the Charged Particle Apparatus, so that information regarding the sample S can be transferred to the Charged Particle Apparatus. Information may comprise sample input information, e.g. information that the human operator enters into the operator input device 114 at the time of loading a sample S into a cassette C.

Above, the system has been discussed in more detail using exemplary embodiments. The desired protection is conferred by the appended claims.

The invention claimed is:

1. A Cryo-Charged Particle (CCP) sample handling and storage system, comprising:
   A storage apparatus for storing a plurality of CCP samples;
   A Charged Particle Apparatus (CPA) at a location remote from said storage apparatus and
   A transfer device that is releasably connectable to said storage apparatus, and wherein said transfer device is furthermore releasably connectable to said CPA, and wherein said transfer device is arranged for acquiring a CCP sample from said plurality of CCP samples when connected to said storage apparatus, and arranged for transferring said CCP sample from said transfer device to said CPA when connected to said CPA.

2. A CCP sample handling system according to claim 1, wherein said transfer device comprises a transfer mechanism that is arranged for acquiring said CCP sample from said storage apparatus when connected to said storage apparatus, and for delivering said CCP sample to said CPA when connected to said CPA.

3. A CCP sample handling system according to claim 2, wherein said transfer mechanism comprises a gripper.

4. A CCP sample handling system according to claim 1, wherein said transfer device is arranged to be transferred from said storage apparatus to said CPA by a human operator.

5. A CCP sample handling system according to claim 1, wherein said storage apparatus and said CPA each comprise a first docking member, and said transfer device comprises a further docking member that is arranged to mate with said first docking member.

6. A CCP sample handling system according to claim 5, wherein each of said first docking members comprises a first valve, and said further docking member comprises a further valve, wherein said valves are arranged to be closed in a dismounted condition, and wherein said valves are arranged to be openable in a docked state.

7. A CCP sample handling system according to claim 1, wherein said storage apparatus comprises a cryogenic storage room.

8. A CCP sample handling system according to claim 1, wherein said storage apparatus comprises at least one cassette for storing said plurality of CCP samples.

9. A CCP sample handling system according to claim 8, wherein said transfer device is arranged for acquiring a sample out of said cassette.

10. A CCP sample handling system according to claim 1, wherein said storage apparatus comprises an operator input device and a control unit, wherein said operator input device is arranged for selecting a CCP sample to be transferred by a human operator, and wherein said control unit is arranged for controlling said storage apparatus and said transfer device for transferring said selected CCP sample from said storage apparatus to said transfer device.

11. A storage apparatus for storing a plurality of Cryo-Charged Particle (CCP) samples for use in a CCP sample handling system according to claim 1, wherein said storage apparatus is arranged to be releasably connectable to a transfer device, and wherein said storage apparatus is arranged for allowing transfer of a sample of said plurality of CCP samples from said storage apparatus to said transfer device in a connected state thereof.

12. A transfer device for transferring a Cryo-Charged Particle (CCP) sample for use in a CCP sample handling system according to claim 1, wherein said transfer device is releasably connectable to a storage apparatus for storing a plurality of CCP samples, and wherein said transfer device is furthermore releasably connectable to a Charged Particle apparatus, and wherein said transfer device is arranged for acquiring a CCP sample from said plurality of CCP samples when connected to said storage apparatus, and arranged for transferring said CCP sample from said transfer device to said CPA when connected to said CPA.

13. A Charged Particle Apparatus (CPA) for use in a Cryo-Charged Particle (CCP) sample handling system according to claim 1, wherein said CPA is arranged to be releasably connectable to a transfer device, and wherein said CPA is arranged for allowing transfer of a sample from said transfer device to said CPA in a connected state thereof.

14. Method for transferring a sample, comprising:
   Storing at least one CCP sample in a storage apparatus;
   Connecting a transfer device to said storage apparatus;
   Transferring said CCP sample from said storage apparatus to said transfer device;
   Dismounting said transfer device from said storage apparatus;
   Moving said transfer device to a Charged Particle Apparatus (CPA) located remotely from said storage apparatus;
   Connecting said transfer device to said CPA; and
   Transferring said CCP sample from said transfer device to said CPA.

15. The method of claim 14, wherein transferring said CCP sample from said storage apparatus to said transfer device includes acquiring said CCP sample from said storage apparatus using a transfer mechanism, and wherein transferring said CCP sample from said transfer device to said CPA includes delivering said CCP sample to said CPA using said transfer mechanism.

16. The method of claim 15, wherein said transfer mechanism comprises a gripper.

17. The method of claim 14, wherein connecting a transfer device to said storage apparatus includes mating a first docking member of said storage apparatus and a further docking member of said transfer device.

18. The method of claim 14, wherein connecting said transfer device to said CPA includes mating a first docking member of said CPA and a further docking member of said transfer device.

19. The method of claim 14, wherein said storage apparatus comprises at least one cassette for storing said plurality of CCP samples, and transferring said CCP sample from said storage apparatus to said transfer device includes transferring a sample out of said cassette and into said transfer device.

\* \* \* \* \*